United States Patent [19]

Murotani

[11] Patent Number: 5,574,696

[45] Date of Patent: Nov. 12, 1996

[54] DYNAMIC RAM DEVICE HAVING HIGH READ OPERATION SPEED

[76] Inventor: Tatsunori Murotani, c/o NEC Corporation, 7-1, Shiba 5-chome, Minato-ku, Tokyo, Japan

[21] Appl. No.: 333,984

[22] Filed: Nov. 2, 1994

[30] Foreign Application Priority Data

Nov. 2, 1993 [JP] Japan .................................. 6-297227

[51] Int. Cl.$^6$ ........................................................ G11C 7/06
[52] U.S. Cl. .......................... 365/205; 365/190; 365/208; 365/222
[58] Field of Search ................................... 365/190, 205, 365/208, 222

[56] References Cited

U.S. PATENT DOCUMENTS

| 4,479,202 | 10/1984 | Uchida | 365/190 |
| 4,504,748 | 3/1985 | Oritani | 365/208 |
| 4,507,759 | 3/1985 | Yasui et al. | 365/208 |
| 5,058,072 | 10/1991 | Kashimura | 365/205 |
| 5,295,103 | 3/1994 | Yamauchi | 365/205 |

FOREIGN PATENT DOCUMENTS

| 63-34793 | 2/1988 | Japan | 365/205 |

*Primary Examiner*—Joseph E. Clawson, Jr.

[57] ABSTRACT

In a dynamic random access memory device including a plurality of word lines, a plurality of bit lines, and a plurality of dynamic memory cells connected to the word lines and the bit lines, a switching circuit is provided between one pair of the bit lines and one sense amplifier, and a switching amplifier is provided between one pair of the bit lines and a read amplifier. Before the connection of the sense amplifier by the switching circuit to the pair of the bit lines, the read amplifier is connected by the switching amplifier to the pair of the bit lines.

18 Claims, 11 Drawing Sheets

DYNAMIC RAM DEVICE HAVING HIGH READ OPERATION SPEED

BACKGROUND OF THE INVENTION

1. Field of the Invention

The present invention relates to a dynamic random access memory (DRAM) device, and more particularly, to an improvement of the read operation speed of the DRAM.

2. Description of the Related Art

The capacity of semiconductor memory devices has been largely developed. In the past years, the capacity of semiconductor memory devices has increased about four times every three years. At present, 256 Mbit DRAM devices have been disclosed at scientific societies and the like, and samples of 64 Mbit DRAM devices have appeared on the market. Since one memory cell of a DRAM device is constructed by two elements, i.e., one metal oxide semiconductor (MOS) transistor and one capacitor, the DRAM devices are advantageous in respect to the integration as compared with static random access memory (SRAM) devices whose memory cell is constructed by six elements. The DRAM devices of one generation have four times the capacity of SRAM devices of the same generation. That is, there is a large difference in capacity between the DRAM devices and the SRAM devices.

On the other hand, the SRAM devices have an advantage in that operation speed is very high. For example, the operation speed time of a 16 Mbit DRAM device is about 60 ns due to its synchronous operation, while that of a 4 Mbit SRAM device is about 20 ns due to its asynchronous operation. However, the asynchronous operation of DRAM devices is not essential. Actually, some DRAM devices can be operated asynchronously in a special mode such as a static column operation mode, and in this case, the operation speed is about 20 ns, the same as in the SRAM devices.

The low operation speed of the DRAM devices is due to the read operation thereof. That is, in a prior art DRAM device including a plurality of word lines, a plurality of bit lines and a plurality of dynamic memory cells connected to the word lines and the bit lines, one pair of the bit lines are connected to one sense amplifier which is connected by a switching circuit to a read amplifier. Therefore, after the sense amplifier is operated to enter a refresh mode, the read amplifier is connected by the switching circuit to the read amplifier to enter a read mode. As a result, the read operation speed is reduced. This will be explained later in detail.

SUMMARY OF THE INVENTION

It is an object of the present invention to provide a high read operation speed DRAM device.

According to the present invention, in a DRAM device including a plurality of word lines, a plurality of bit lines and a plurality of dynamic memory cells connected to the word lines and the bit lines, a switching circuit is provided between one pair of the bit lines and one sense amplifier, and a switching amplifier is provided between one pair of the bit lines and a read amplifier. Before the connection of the sense amplifier by the switching circuit to the pair of the bit lines, the read amplifier is connected by the switching amplifier to the pair of the bit lines. That is, before entering a refresh mode, the control enters a read mode.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENTS

Before the description of the preferred embodiments, a prior art DRAM device will be explained with reference to FIGS. 1, 2 and 3.

Figure 1:
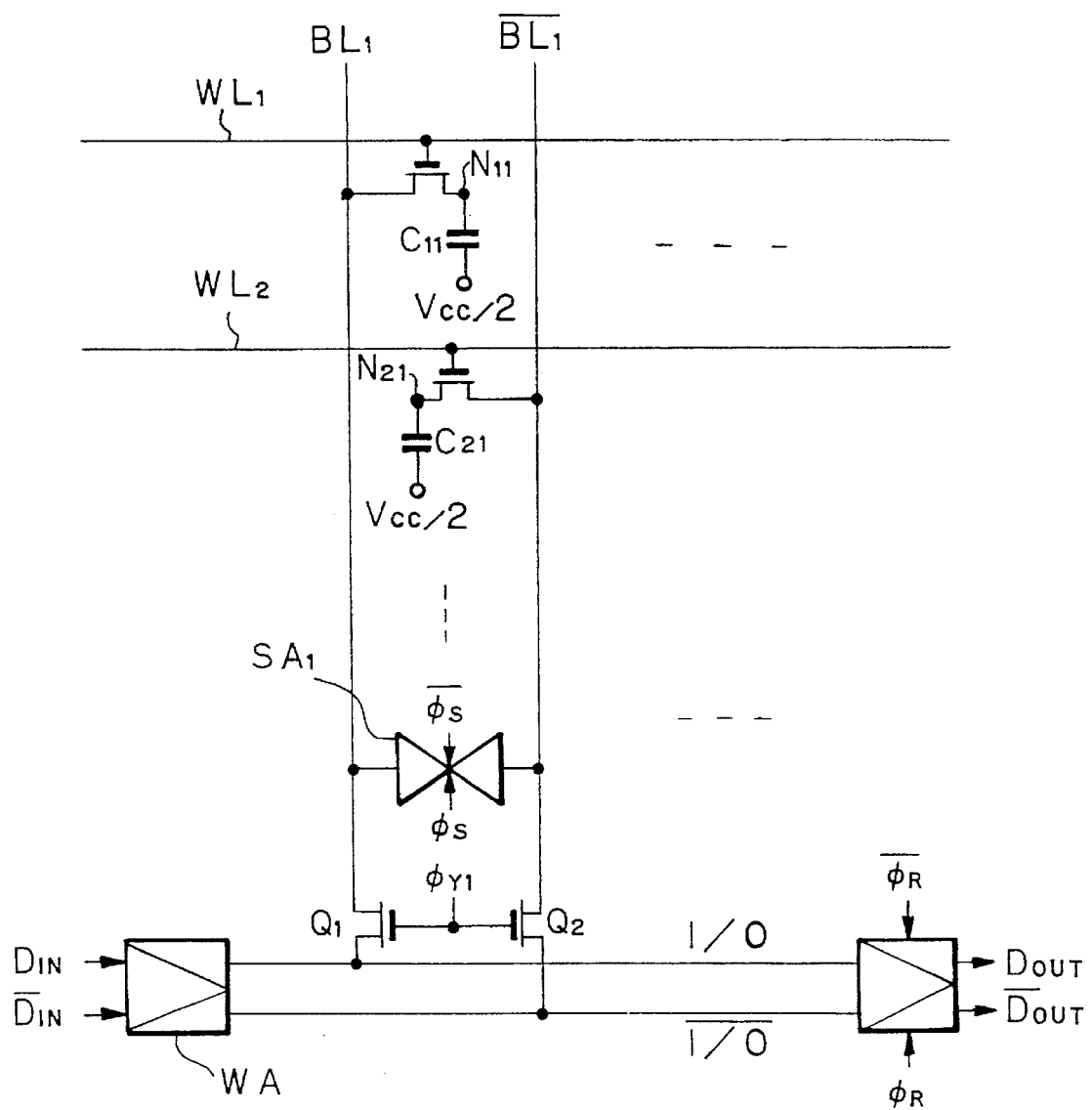
FIG. 1 is a circuit diagram illustrating a prior art DRAM device.

In FIG. 1, which is a circuit diagram illustrating a prior art DRAM device, memory cells $C_{11}, \ldots, C_{21}, \ldots$ are provided at staggered intersections of word lines $WL_1, WL_2, \ldots$ and bit lines $BL_1, \overline{BL_1}, \ldots$ One pair of the bit lines, such as $BL_1$ and $\overline{BL_1}$, are connected to one sense amplifier $SA_1$ having a refresh function or a rewriting function. Also, the bit lines, such as $BL_1$ and $\overline{BL_1}$, are connected by column selection transistors $Q_1$ and $Q_2$ to input/output lines I/O and $\overline{I/O}$. The column selection transistors $Q_1$ and $Q_2$ are controlled by a Y selection signal $\phi_{Y1}$. Therefore, one pair of the bit lines are selected by Y address signals, and are connected to the input/output lines I/O and $\overline{I/O}$. The input/output lines I/O and $\overline{I/O}$ are connected to a read amplifier RA and a write amplifier WA.

Figure 2:
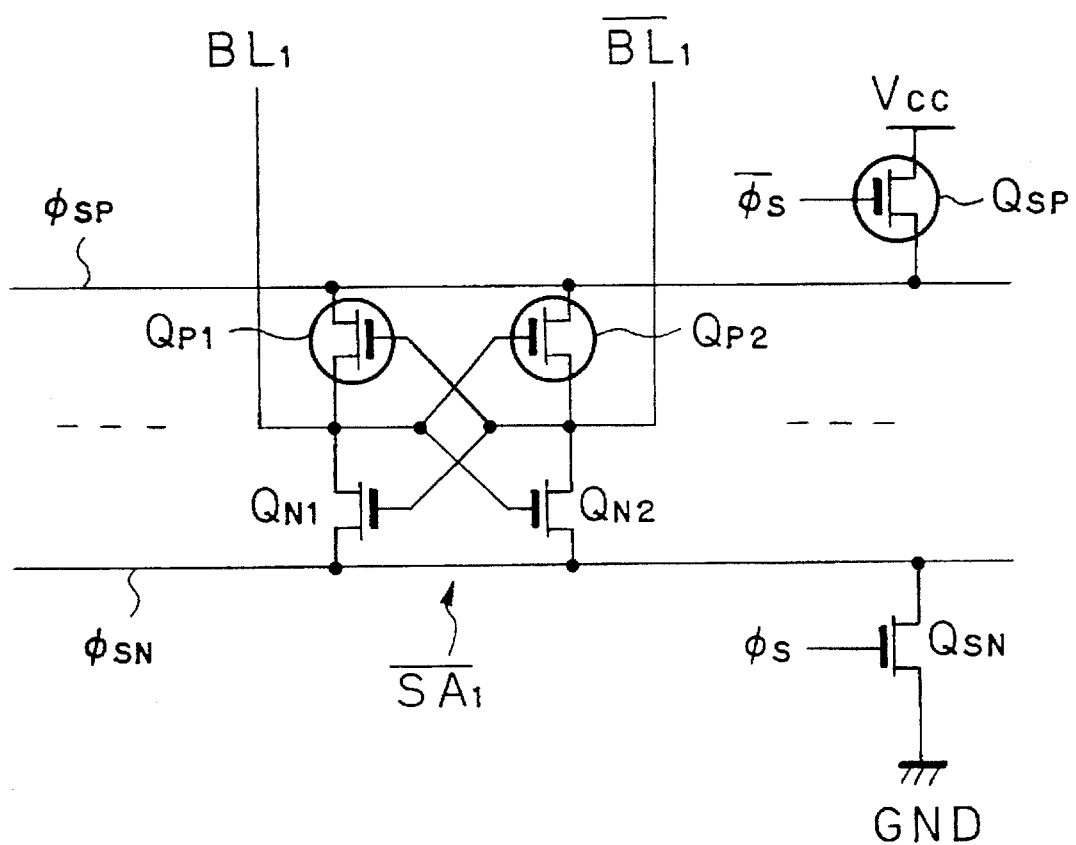
FIG. 2 is a detailed circuit diagram of the sense amplifier of FIG. 1.

As illustrated in FIG. 2, the sense amplifier $SA_1$ is constructed by a flip-flop formed by P-channel transistors $Q_{P1}$ and $Q_{P2}$ connected to a driving line $\phi_{SP}$, and N-channel transistors $Q_{N1}$ and $Q_{N2}$ connected to a driving line $\phi_{SN}$. When a P-channel transistor $Q_{SP}$ is turned ON by a sense activation signal $\phi_S$, the high voltage line $\phi_{SP}$ is made $V_{cc}$. On the other hand, when an N-channel transistor $Q_{SN}$ is turned ON by a sense activation signal $\phi_S$, the high voltage line $\phi_{SN}$ is made GND. Information is stored as a charge in a capacitor of a memory cell such as $C_{11}$. In a read mode, the charge stored in the capacitor $C_{11}$ is divided between the capacity of the capacitor $C_{11}$ and a parasitic capacity of a bit line $BL_1$, and as a result, a difference in potential is generated between the bit lines $BL_1$ and $\overline{BL_1}$. In this case, although a capacitance ratio of the bit line $BL_1$ to the memory cell $C_{11}$ is very large, this difference in potential is less than 100 mV. Also, the charge stored in the memory cell $C_{11}$ is almost discharged to the bit line $BL_1$, and therefore, the information stored in the memory cell $C_{11}$ is almost destroyed. In order to amplify the signals on the bit lines and remedy or refresh the information stored in the memory cells, the sense amplifier, such as $SA_1$, is connected to the bit lines $BL_1$ and $\overline{BL_1}$.

Figure 3A:
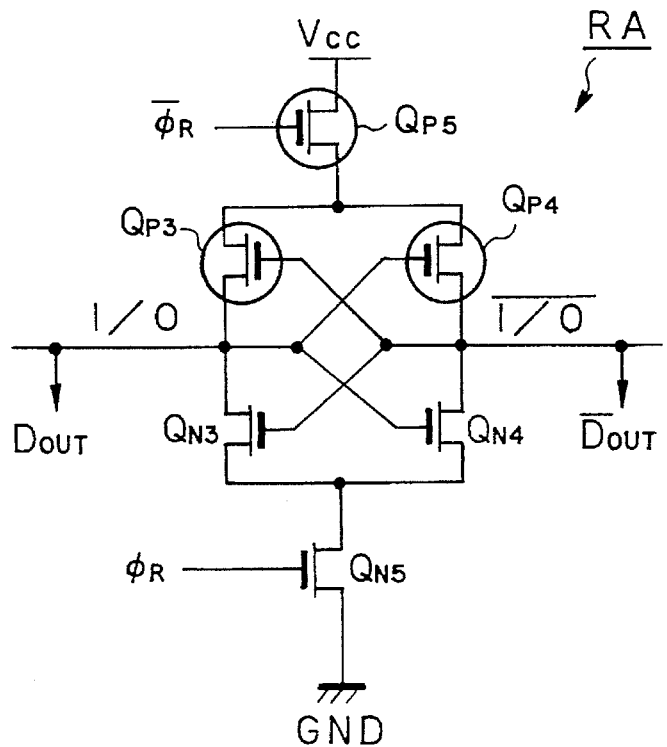
FIG. 3A is a detailed circuit diagram of the read amplifier of FIG. 1.

As illustrated in FIG. 3A, the read amplifier RA has a similar configuration to the sense amplifier $SA_1$. That is, the read amplifier RA is constructed by P-channel transistors $Q_{P3}$, $Q_{P4}$ and $Q_{P5}$ corresponding to the transistors $Q_{P1}$, $Q_{P2}$ and $Q_{SP}$, respectively, of FIG. 2 and N-channel transistors $Q_{N3}$, $Q_{N4}$ and $Q_{N5}$ corresponding to the transistors $Q_{N1}$, $Q_{N2}$ and $Q_{SN}$, respectively, of FIG. 2. Thus, the read amplifier RA is controlled by read signals $\phi_R$ and $\overline{\phi}_R$ to amplify the difference in potential between the input/output lines I/O and $\overline{\text{I/O}}$, to thereby generate output data signals $D_{OUT}$ and $\overline{D}_{OUT}$.

Figure 3B:
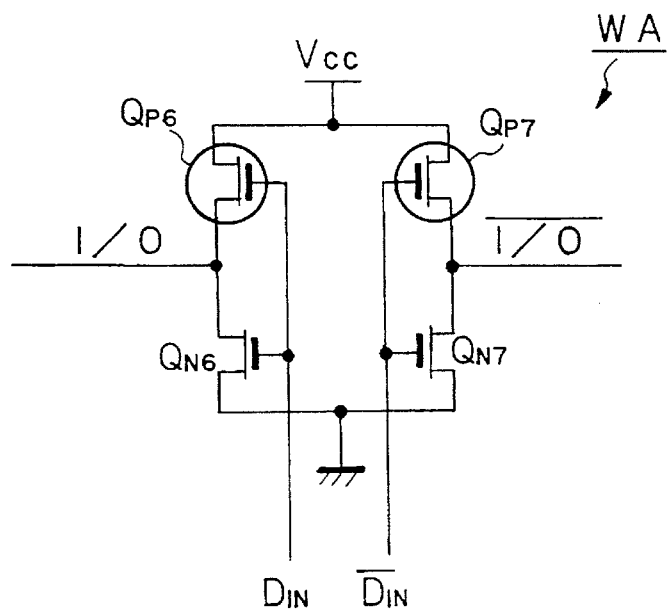
FIG. 3B is a detailed circuit diagram of the write amplifier of FIG. 1.

Also, as illustrated in FIG. 3B, the write amplifier WA is constructed by an inverter formed by P-channel transistors $Q_{P6}$ and $Q_{P7}$ and N-channel transistors $Q_{N6}$ and $Q_{N7}$. Thus, the write amplifier WA forcibly changes voltages at the input/output lines I/O and $\overline{\text{I/O}}$ in accordance with input data signals $D_{IN}$ and $\overline{D}_{IN}$.

A read operation upon the device of FIG. 1 is explained next with reference to FIG. 4. Assume that the bit lines $BL_1$ and $\overline{BL_1}$ and the input/output lines I/O and $\overline{\text{I/O}}$ are precharged at $V_{cc}/2$ by a precharging circuit (not shown).

At time $t_0$, an external row address strobe signal $\overline{RAS}$ is made low to enter a selection mode. As a result, a control circuit (not shown) is operated to operate an X-address buffer/decoder (not shown). Thus, at time $t_1$, the voltage at a selected word line such as $WL_1$ is made higher than $V_{cc}$.

When the voltage at the word line $WL_1$ is made higher, the transistor of the memory cell $C_{11}$ is completely turned ON. As a result, the charge at the node $N_{11}$ is divided between the the capacitor of the memory cell $C_{11}$ and the bit line $BL_1$, and therefore, a difference $\Delta V$ in potential is generated between the bit lines $BL_1$ and $\overline{BL_1}$. In this case, since a capacitance ratio of the bit line $BL_1$ to the capacitor of the memory cell $C_{11}$ is very large, this difference is very small, for example, about 100 mV.

At time $t_2$, the transistors $Q_{SP}$ and $Q_{SN}$ of the sense amplifier $SA_1$ are turned ON by the sense activation signals $\overline{\phi}_S$ and $\phi_S$, so that the control enters a refresh mode. That is, the sense amplifier $SA_1$ is activated by causing the voltage lines $\phi_{SP}$ and $\phi_{SN}$ to be $V_{cc}$ and 0 V (GND), respectively. As a result, the voltage at the bit line $BL_1$ on a lower voltage side becomes 0 V, and the voltage at the bit line $\overline{BL_1}$ becomes $V_{cc}$, thus carrying out a sense operation as well as a refresh operation.

At time $t_3$, when the sense operation and the refresh operation have been carried out, the transistors $Q_1$ and $Q_2$ are turned ON by the Y selection signal $\phi_{Y1}$, so that the signals at the bit lines $BL_1$ and $\overline{BL_1}$ are transferred to the input/output lines I/O and $\overline{\text{I/O}}$, respectively. In this case, the transfer of the signals from the bit lines bit lines $BL_1$ and $\overline{BL_1}$ is initially carried out in accordance with a capacitance ratio of the bit lines $BL_1$ and $\overline{BL_1}$ to the input/output lines I/O and $\overline{\text{I/O}}$. That is, in an initial state, the amounts of the signals at the bit lines $BL_1$ and $\overline{BL_1}$ are reduced. Then, the read amplifier RA initiates an amplifying operation upon the input/output lines I/O and $\overline{\text{I/O}}$ by the read signals $\phi_R$ and $\overline{\phi}_R$. Finally, the voltages at the bit lines $BL_1$ and $\overline{BL_1}$ as well as the voltages at the input/output lines I/O and $\overline{\text{I/O}}$ are amplified to $V_{cc}$ and GND.

Then, at time $t_4$, the control returns to a stand-by mode.

Figure 5:
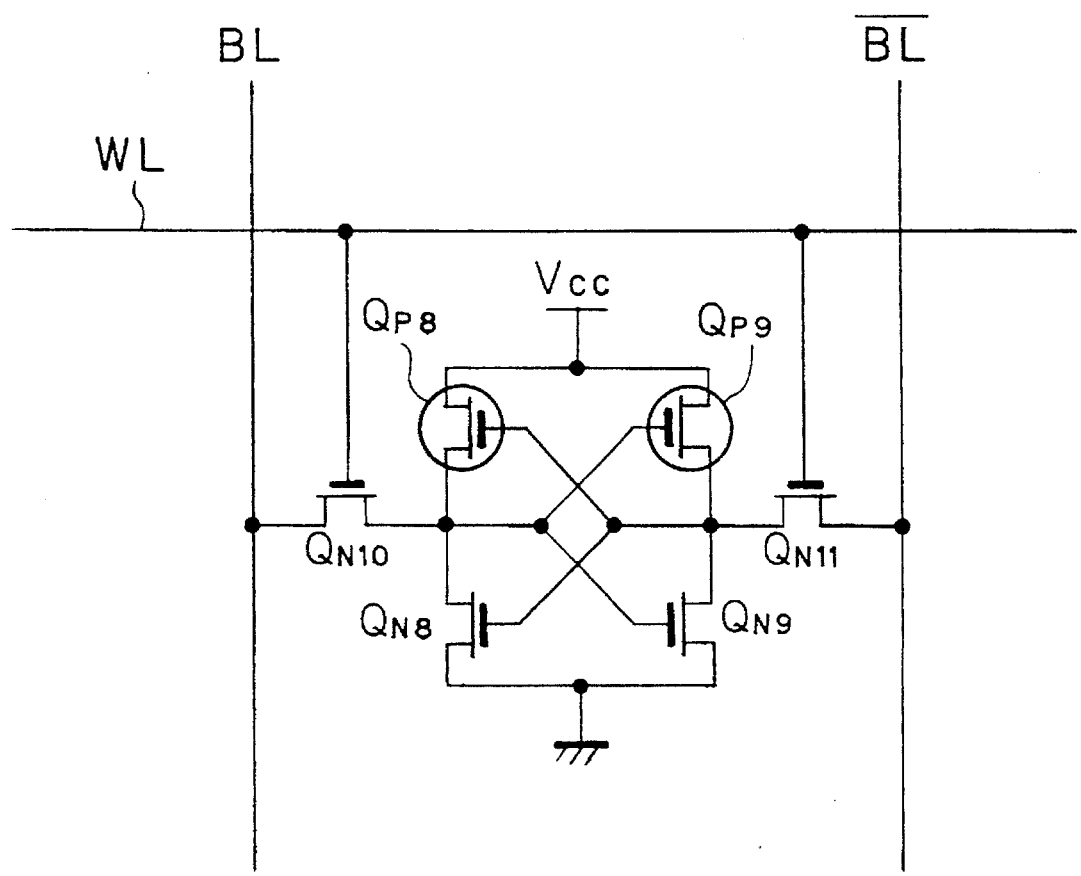
FIG. 5 is a circuit diagram illustrating one memory cell of a prior art SRAM device.

On the other hand, as illustrated in FIG. 5, a memory cell of a SRAM device is constructed by a flip-flop formed by P-channel transistors $Q_{P8}$ and $Q_{P9}$ and N-channel transistors $Q_{N8}$ and $Q_{N9}$, and transfer gates $Q_{N10}$ and $Q_{N11}$. The transfer gates $Q_{N10}$ and $Q_{N11}$ are controlled by a voltage at a word line WL, to thereby connect cell nodes to bit lines BL and $\overline{BL}$. That is, in the sense amplifier $SA_1$ of FIG. 2, when the high voltage line $\phi_{SP}$ and the low voltage line $\phi_{SN}$ are fixed at $V_{cc}$ and GND, respectively, the sense amplifier $SA_1$ of FIG. 2 serves as the memory cell of the SRAM device. Therefore, the memory cell of the SRAM device per se has an amplification function, and therefore, can output larger or higher levels of signals to the bit lines BL and $\overline{BL}$. Thus, the SRAM device does not require a refresh operation and sense amplifiers as in the DRAM device. In other words, in the SRAM device, since an sense amplifier is included in each of the memory cells, signals are transmitted to the input/output lines without waiting for the operation of the sense amplifiers. Thus, the read operation speed of the SRAM device is higher than that of the DRAM device.

Figure 6:
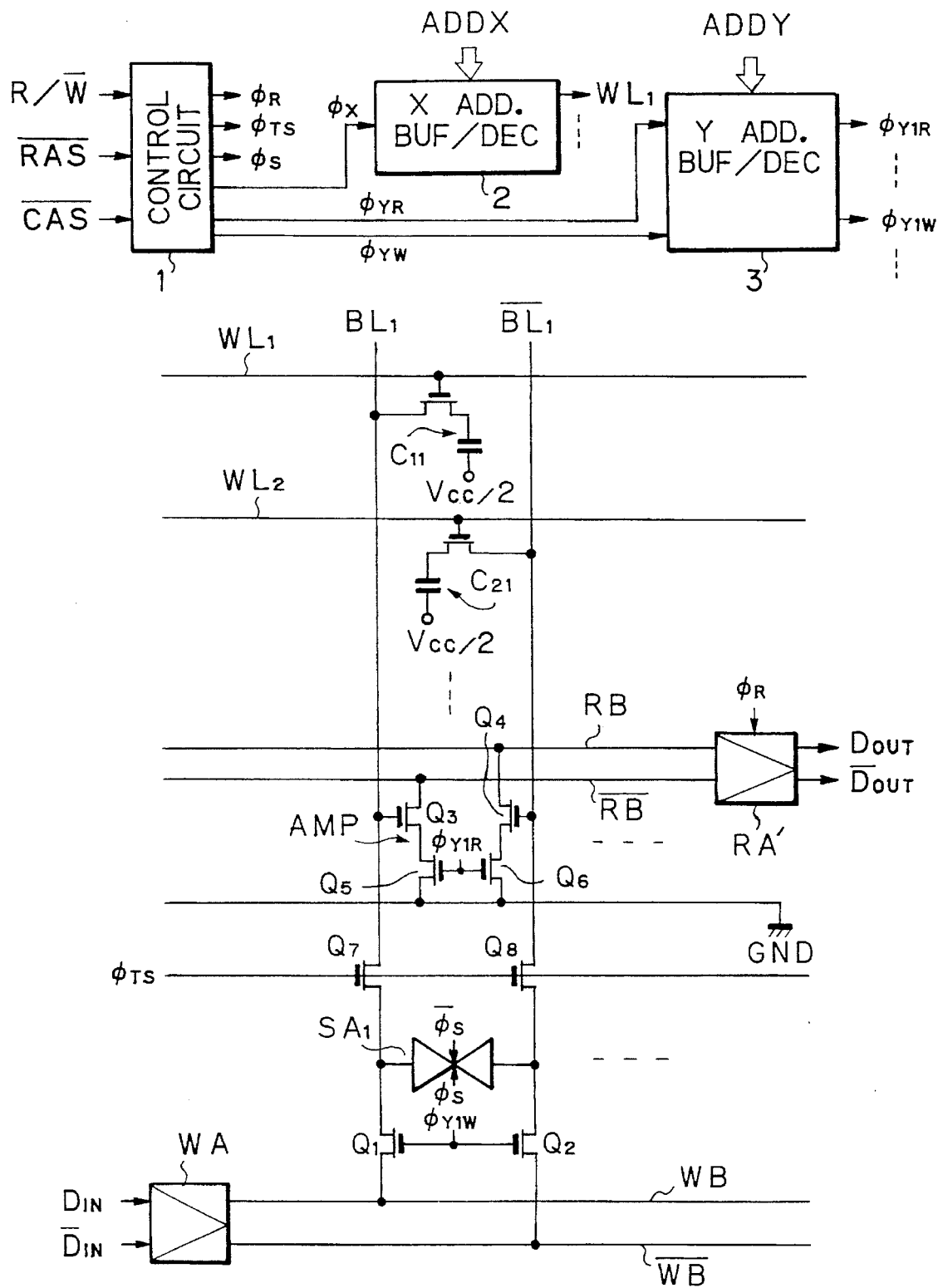
FIG. 6 is a circuit diagram illustrating a first embodiment of the DRAM device according to the present invention.

In FIG. 6, which illustrates a first embodiment of the present invention, the input/output lines I/O and $\overline{\text{I/O}}$ of FIG. 1 are divided into read bus lines RB and $\overline{RB}$ and write bus lines WB and $\overline{WB}$. In other words, the input/output lines I/O and $\overline{\text{I/O}}$ of FIG. 1 correspond to the write bus lines WB and $\overline{WB}$ specifically for a write operation, and the read bus lines RB and $\overline{RB}$ are added specifically for a read operation.

A connection between the bit lines $BL_1$ and $\overline{BL_1}$ and the read bus lines RB and $\overline{RB}$ is carried out not by a direct coupling such as a drain-source coupling of transistors such as $Q_1$ and $Q_2$, but by a capacitive coupling. That is, an amplifier AMP is interposed between the bit lines $BL_1$ and $\overline{BL_1}$ and the read bus lines RB and $\overline{RB}$. The amplifier AMP is constructed by P-channel transistors $Q_3$ and $Q_4$ and N-channel transistors $Q_5$ and $Q_6$. The bit lines $BL_1$ and $\overline{BL_1}$ are connected to gates of the transistors $Q_3$ and $Q_4$, respectively, and the read lines RB and $\overline{RB}$ are connected to drains of the transistors $Q_3$ and $Q_4$. Therefore, since gate insulating layers of the transistors $Q_3$ and $Q_4$ are interposed between the bit lines $BL_1$ and $\overline{BL_1}$ and the read bus lines RB and $\overline{RB}$, no current flow therethrough. Also, although the levels of signals to be transmitted are reduced in accordance with the gate capacities of the gate insulating layers of the transistors $Q_3$ and $Q_4$, the reduced levels of signals are negligible due to the fact that these gate capacities are very small. Also, the difference in potential between the bit lines $BL_1$ and $\overline{BL_1}$ is amplified by the transistors $Q_3$ and $Q_4$, so that the transmission of signals from the bit lines $BL_1$ and $\overline{BL_1}$ to the read bus lines RB and $\overline{RB}$ is carried out at a high speed.

The N-channel transistors $Q_5$ and $Q_6$ of the amplifier AMP are interposed between the sources of the N-channel transistors $Q_3$ and $Q_4$ thereof and the ground GND, and is controlled by a Y selection signal $\phi_{Y1R}$ for a read mode. Therefore, only during a read mode ($\phi_{Y1R}$="1"), the transistors $Q_5$ and $Q_6$ are turned ON to activate the amplifier AMP.

Note that a Y selection signal $\phi_{Y1W}$ for a write operation is used for turning ON the transistors $Q_1$ and $Q_2$. Therefore, the read bus lines RB and $\overline{RB}$ and the write bus lines WB and $\overline{WB}$ are selectively operated for a read mode and a write mode.

Further, transistors $Q_7$ and $Q_8$ are interposed between the bit lines $BL_1$ and $\overline{BL_1}$ and the sense amplifier $SA_1$. The transistors $Q_7$ and $Q_8$ are turned ON and OFF by a clock signal $\phi_{TS}$. Therefore, during a read mode when the signals at the bit lines $BL_1$ and $\overline{BL_1}$ are transmitted by the amplifier $AMP$ to the read bus lines $RB$ and $\overline{RB}$, the transistors $Q_7$ and $Q_8$ are turned OFF by the clock signal $\phi_{TS}$ to separate the sense amplifier $SA_1$ from the bit lines $BL_1$ and $\overline{BL_1}$. As a result, since the capacity of the sense amplifier $SA_1$ does not affect the operation of the bit lines $BL_1$ and $\overline{BL_1}$, the read operation speed can be enhanced. Then, after the operation of the read bus lines $RB$ and $\overline{RB}$ has been sufficiently advanced, the transistors $Q_7$ and $Q_8$ are turned ON by the clock signal $\phi_{TS}$, to thereby activate the sense amplifier $SA_1$, thus carrying out a refresh operation.

In FIG. 6, reference numeral 1 designates a control circuit for receiving a read/write signal $R/\overline{W}$, a row address strobe signal $\overline{RAS}$ and a column address strobe signal $\overline{CAS}$, to generate the read signal $\phi_R$, the clock signal $\phi_{TS}$, the sense activation signal $\phi_S$, an X address control signal $\phi_x$, a Y address control signal $\phi_{YR}$ for a read operation, and a Y address control signal $\phi_{YW}$. Also, an X address buffer/decoder 2 is triggered by the X address control signal $\phi_x$ to receive X address signals ADDX, to select one of the word lines $WL_1, WL_2, \ldots$ and make it high ($V_{cc}+\alpha$). Further, a Y address buffer/decoder 3 is triggered by the Y address control signal $\phi_{YR}$ or the Y address control signal $\phi_{YW}$ to receive Y address signals ADDY, thus selecting one of the Y selection signals such as $\phi_{Y1R}$ or one of the Y selection signals such as $\phi_{Y1W}$ and make it high.

Figure 7:
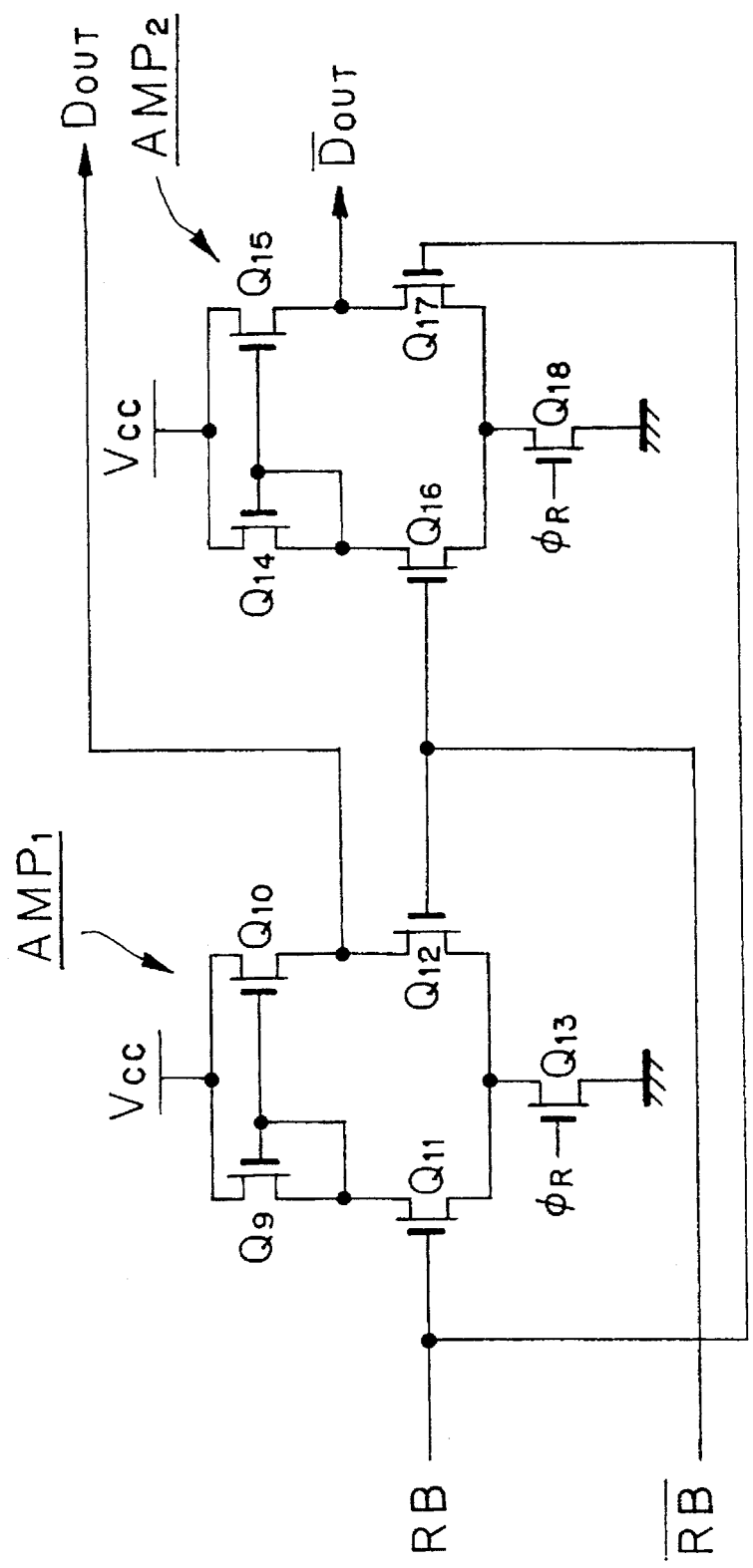
FIG. 7 is a detailed circuit diagram of the read amplifier of FIG. 6.

As illustrated in FIG. 7, the read amplifier RA' is constructed by an amplifier $AMP_1$ formed by P-channel transistors $Q_9$ and $Q_{10}$, N-channel transistors $Q_{11}$, $Q_{12}$ and $Q_{13}$, and an amplifier $AMP_2$ formed by P-channel transistors $Q_{14}$ and $Q_{15}$, N-channel transistors $Q_{16}$, $Q_{17}$ and $Q_{18}$. In the amplifier $AMP_1$, the transistors $Q_9$ and $Q_{10}$ form a current mirror circuit, and the transistors $Q_{11}$ and $Q_{12}$ form a current switch. The amplifier $AMP_1$ is controlled by the read signal $\phi_R$ to amplify the difference in potential between the read bus lines $RB$ and $\overline{RB}$, thus generating the read data signal $D_{OUT}$. Similarly, in the amplifier $AMP_2$, the transistors $Q_{14}$ and $Q_{15}$ form a current mirror circuit, and the transistors $Q_{16}$ and $Q_{17}$ form a current switch. The amplifier $AMP_1$ is controlled by the read signal $\phi_R$ to amplify the difference in potential between the read bus lines $RB$ and $\overline{RB}$, thus generating the read data signal $\overline{D}_{OUT}$.

Thus, in the first embodiment as illustrated in FIG. 6, since the signals at the bit lines $BL_1$ and $\overline{BL_1}$ are transmitted to the read bus lines $RB$ and $\overline{RB}$ before the operation of the sense amplifier $SA_1$, the levels of signals transmitted from the memory cell $C_{11}$ to the bit lines $BL_1$ and $\overline{BL_1}$ are as large as possible. The levels of signals are dependent upon the capacitance ratio of the bit lines to the memory cell, and the capacitance of the bit lines includes the capacitance of the sense amplifier $SA_1$ in the prior art. In the first embodiment, however, the capacitance of the bit lines contributing to a read operation does not include the capacitance of the sense amplifier $SA_1$, since the sense amplifier $SA_1$ is separated from the bit lines $BL_1$ and $\overline{BL_1}$ before the operation of the sense amplifier $SA_1$. Here, since the capacitance of the sense amplifier $SA_1$ is about half of that of the bit lines $BL_1$ and $\overline{BL_1}$ per se, the levels of signals at the bit lines $BL_1$ and $\overline{B_1}$ before the operation of the sense amplifier $SA_1$ can about be 1.5 times that in the prior art, to thereby contribute to the operation of the amplifier AMP.

Note that the sense amplifier $SA_1$ is not unnecessary, that is, the sense amplifier $SA_1$ carries out a refresh operation after the bit lines $BL_1$ and $\overline{BL_1}$ are connected to the sense amplifier $SA_1$.

Figure 8:
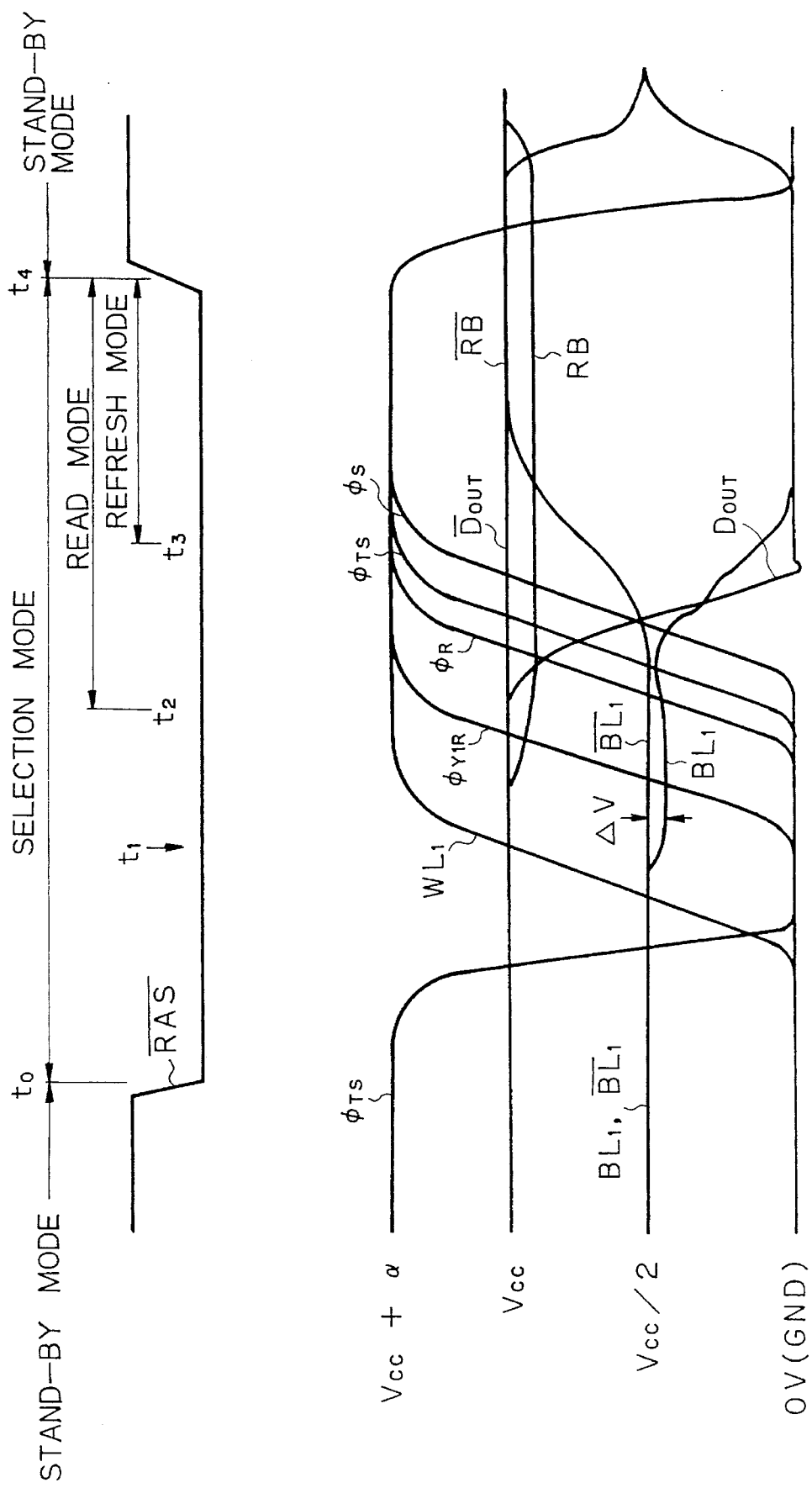
FIG. 8 is a timing diagram showing the operation of the device of FIG. 6.

A read operation upon the device of FIG. 6 is explained next with reference to FIG. 8. Assume that the bit lines $BL_1$ and $\overline{BL_1}$ are precharged at $V_{cc}/2$ and the read bus lines $RB$ and $\overline{RB}$ are precharged at $V_{cc}$ by a precharging circuit (not shown).

At time $t_0$, an external row address strobe signal $\overline{RAS}$ is made low to enter a selection mode. As a result, the control circuit 1 is operated to change the clock signal $\phi_{TS}$ from high ($V_{cc}+\alpha$) to low (GND). Thus, the sense amplifier $SA_1$ is separated from the bit lines $BL_1$ and $\overline{BL_1}$. Also, the control circuit 1 generates the X address access signal $\phi_x$ and transmits it to the X address buffer/decoder 2.

Then, at time $t_1$, the X address buffer/decoder 1 selects one word line such as $WL_1$ and changes it from low (GND) to high ($V_{cc}+\alpha$).

When the voltage at the word line $WL_1$ is made higher, the transistor of the memory cel $C_{11}$ is completely turned ON. As a result, the charge at the node $N_{11}$ is divided between the the capacitor of the memory cell $C_{11}$ and the bit line $BL_1$, and therefore, a difference $\Delta V$ in potential is generated between the bit lines $BL_1$ and $\overline{BL_1}$. In this case, the difference $\Delta V$ in potential is larger than the prior art, since the capacitance of the sense amplifier $SA_1$ does not contribute to the capacitance of the bit lines $BL_1$ and $\overline{BL_1}$. As a result, the voltages at the bit lines $BL_1$ and $\overline{BL_1}$ are applied to the gates of the transistors $Q_3$ and $Q_4$, respectively, of the amplifier AMP.

At time $t_2$, when the charge at the memory cell $C_{11}$ is completely discharged to the bit line $BL_1$, the Y address buffer/decoder 3 is triggered by the clock signal $\phi_{YR}$ to receive the Y address signals ADDY, to select one of the Y selection signals, such as $\phi_{Y1R}$ and change it from low (GND) to high. As a result, the transistors $Q_5$ and $Q_6$ of the amplifier AMP are turned ON, so that the signals at the bit lines $BL_1$ and $\overline{BL_1}$ are read out to the read bus lines $RB$ and $\overline{RB}$. Note that, in this case, the voltages at the read bus lines $RB$ and $\overline{RB}$ do not reach GND. Next, the control circuit 1 changes the read signal $\phi_R$ from low (GND) to high, to operate the read amplifier RA', and therefore, the signals at the read bus lines $RB$ and $\overline{RB}$ are transferred to the output data lines $D_{OUT}$ and $\overline{D}_{OUT}$.

Next, at time $t_3$, the control circuit 1 changes the clock signal $\phi_{TS}$ from low (GND) to high ($V_{cc}+\alpha$) to turn ON the transistors $Q_7$ and $Q_8$. Thus, the bit lines $BL_1$ and $\overline{BL_1}$ are connected to the sense amplifier $SA_1$, to enter a refresh mode. After a little time has passed, the transistors $Q_{SP}$ and $Q_{SN}$ of the sense amplifier $SA_1$ are turned ON by the sense activation signals $\overline{\phi}_S$ and $\phi_S$, that is, the sense amplifier $SA_1$ is activated by causing the voltage lines $\phi_{SP}$ and $\phi_{SN}$ to be $V_{cc}$ and 0 V (GND), respectively. As a result, the voltage at the bit line $BL_1$ on a lower voltage side becomes 0 V, and the voltage at the bit line $BL_1$ becomes $V_{cc}$, thus carrying out a sense operation as well as a refresh operation.

Then, at time $t_4$, the control returns to a stand-by mode.

Figure 4:
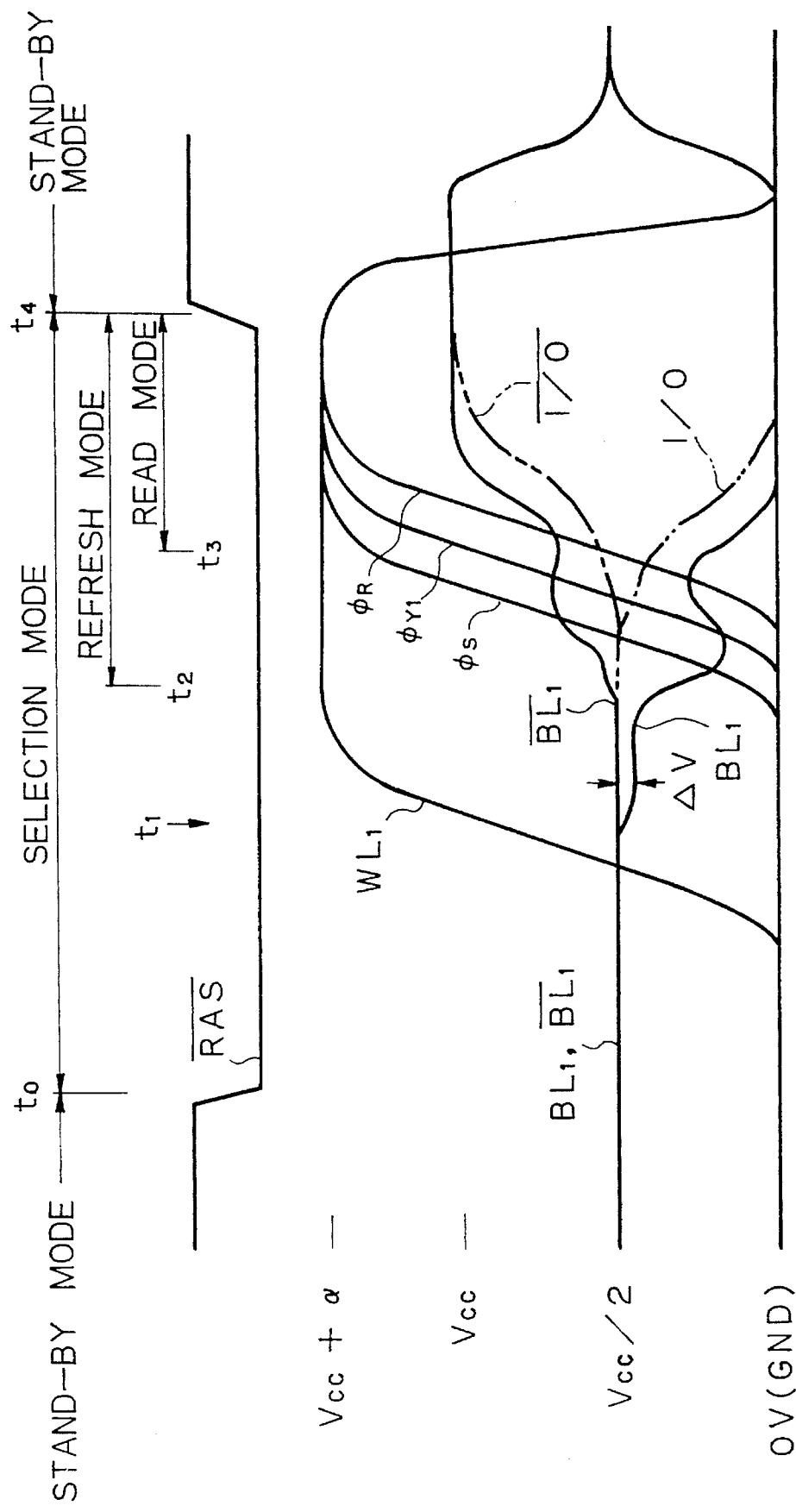
FIG. 4 is a timing diagram showing the operation of the device of FIG. 1.

As shown in FIG. 4, in the prior art, the control enters a read mode after entering a refresh mode. Conversely, as shown in FIG. 8, in the first embodiment, the control enters a read mode before entering a refresh mode.

Figure 9:
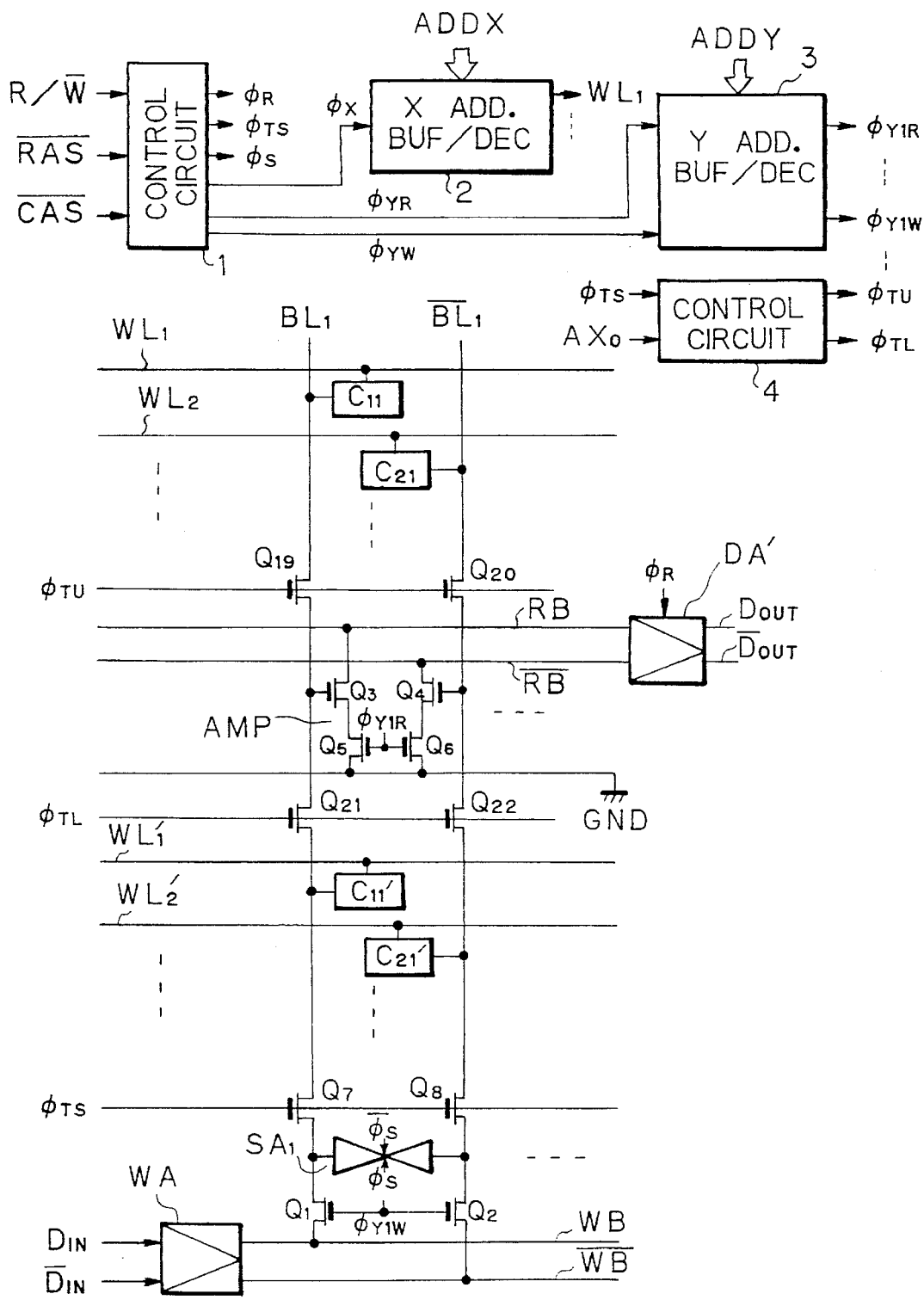
FIG. 9 is a circuit diagram illustrating a second embodiment of the DRAM device according to the present invention.

In FIG. 9, which illustrates a second embodiment of the present invention, the bit lines are divided into two portions, to thereby increase the levels of signals transmitted from the memory cells to the bit lines. That is, since the bit lines are divided at their center portions, the read bus lines $RB$ and $\overline{RB}$ and the amplifier RA' are connected to the center portions. Also, a control circuit 4 is added. The control circuit 4 receives the clock signal $\phi_{TS}$ and one X address signal such as $AX_0$ to generate two clock signals $\phi_{TU}$ and $\phi_{TL}$ which are supplied to a pair of transistors $Q_{19}$ and $Q_{20}$ and a pair of transistors $Q_{21}$ and $Q_{22}$.

Figure 10:
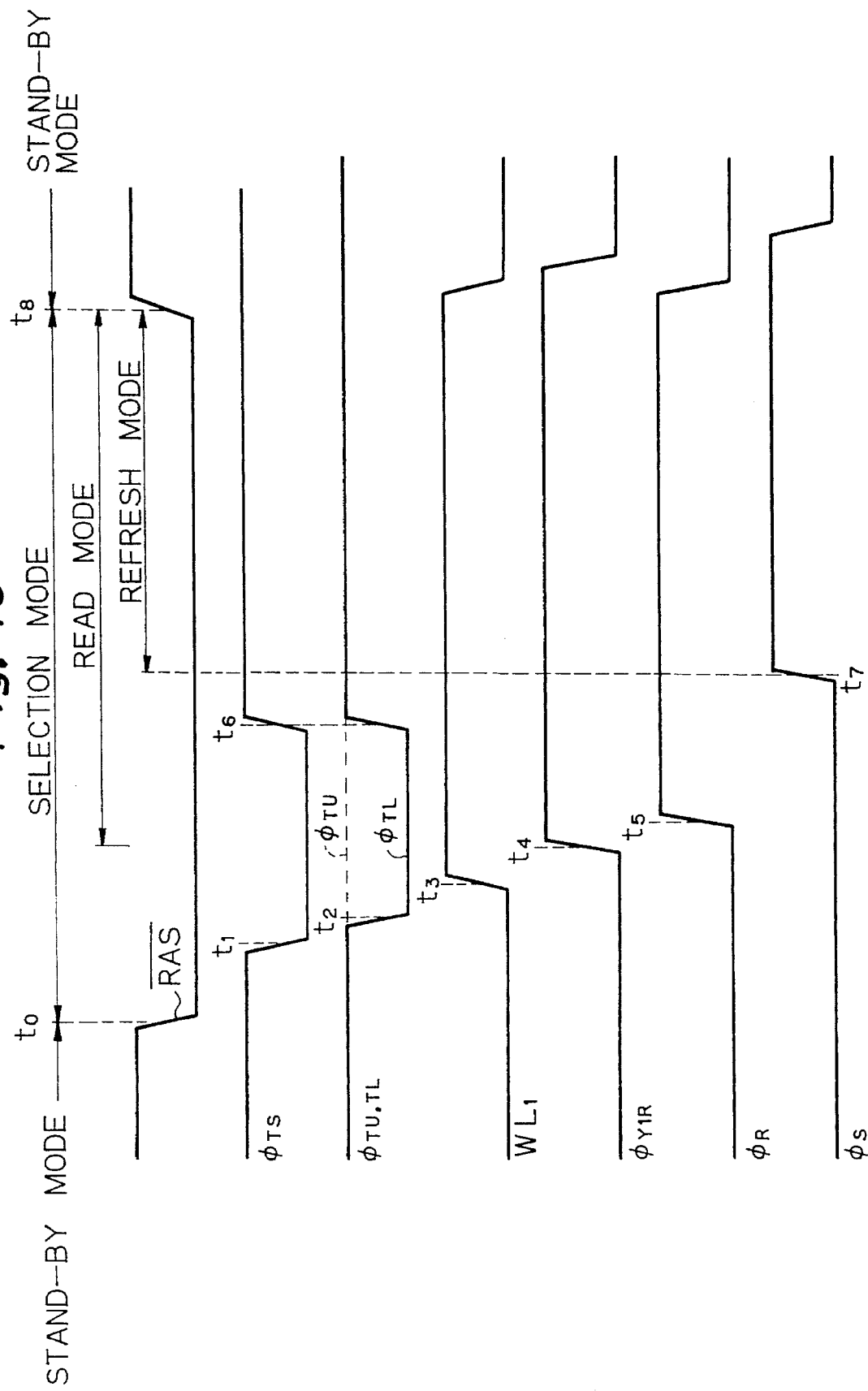
FIG. 10 is a timing diagram showing the operation of the device of FIG. 9.

A read operation of the device of FIG. 9 is explained next with reference to FIG. 10. In FIG. 10, the operation of connection/disconnection of the bit lines is mainly shown, and the voltages of the bit lines, which are the same as those of FIG. 6, are omitted.

In a stand-by state before time $t_0$, all of the clock signals $\phi_{TS}$, $\phi_{TU}$ and $\phi_{TL}$ are high ($V_{cc}+\alpha$), and therefore, all of the transistors $Q_7$, $Q_8$, $Q_{19}$, $Q_{20}$, $Q_{21}$ and $Q_{22}$ are turned ON. Also, the bit lines $BL_1$ and $\overline{BL_1}$ are precharged at $V_{cc}/2$ by the precharging circuit (not shown).

At time $t_0$, the row address strobe signal $\overline{RAS}$ is made low to enter a selection mode. As a result, at time $t_1$, the control circuit 1 is operated to change the clock signal $\phi_{TS}$ from high ($V_{cc}+\alpha$) to low (GND). Thus, the sense amplifier $SA_1$ is separated from the bit lines $BL_1$ and $\overline{BL_1}$.

At time $t_2$, the control circuit 4 changes one of the clock signals $\phi_{TU}$ and $\phi_{TL}$ from high ($V_{cc}+\alpha$) to low (GND) in accordance with the one bit $AX_0$ of the X address signals ADDX. That is, the portion of the bit lines, to which a selected memory cell is connected, is separated from the amplifier AMP. For example, when the word line $WL_1$ is selected, the clock signal $\phi_{TL}$ is made low to turn OFF the transistors $Q_{21}$ and $Q_{22}$. Conversely, when the word line $WL_1'$ is selected, the clock signal $\phi_{TU}$ is made low to turn OFF the transistors $Q_{19}$ and $Q_{20}$.

Next, at time $t_3$, one word line such as $WL_1$ is changed from low (GND) to high ($V_{cc}+\alpha$), the signal of the memory cell $C_{11}$ is generated in the bit line $BL_1$.

Next, at time $t_4$, the Y selection signal $\phi_{Y1R}$ for a read operation is changed from low (GND) to high ($V_{cc}+\alpha$), so that the signals at the bit lines $BL_1$ and $\overline{BL_1}$ are transferred to the read bus lines RB and $\overline{RB}$.

At time $t_5$, the read signal $\phi_R$ is changed from low (GND) to high ($V_{cc}+\alpha$), so that the difference in potential between the read bus lines RB and $\overline{RB}$ is amplified by the read amplifier RA'. Thus, the read data signals $D_{OUT}$ and $\overline{D}_{OUT}$ are generated from the read amplifier RA'.

At time $t_6$, when the read operation by the read amplifier RA' has been proceeded, the clock signals $\phi_{TS}$, $\phi_{TU}$ and $\phi_{TL}$ are all made high ($V_{cc}+\alpha$). As a result, the bit lines $BL_1$ and $\overline{BL_1}$ are connected to the sense amplifier $SA_1$.

Next, at time $t_7$, the sense activation signal $\phi_s$ is changed from low (GND) to high ($V_{cc}+\alpha$), to activate the sense amplifier $SA_1$, entering a refresh mode.

Finally, at time $t_8$, the row address strobe signal $\overline{RAS}$ is changed from low to high, so that the control returns to a stand-by mode.

Thus, in the second embodiment, the capacitance of a portion of the bit lines contributing to a read operation does not include half of that of the bit lines per se including the capacitance of the sense amplifier $SA_1$, since the half of the bit lines as well as the sense amplifier $SA_1$ are separated from the portion of the bit lines $BL_1$ and $\overline{BL_1}$, to which the selected word line such as $WL_1$ is connected, before the sense amplifier $SA_1$ is operated. That is, the capacitance contributed to the read operation is about ⅓ as compared with the prior art, and therefore, the levels of signals at the bit lines $BL_1$ and $\overline{BL_1}$ before the operation of the sense amplifier $SA_1$ can be about 3 times that of the prior art, to thereby contribute to the operation of the amplifier AMP.

Figure 11:
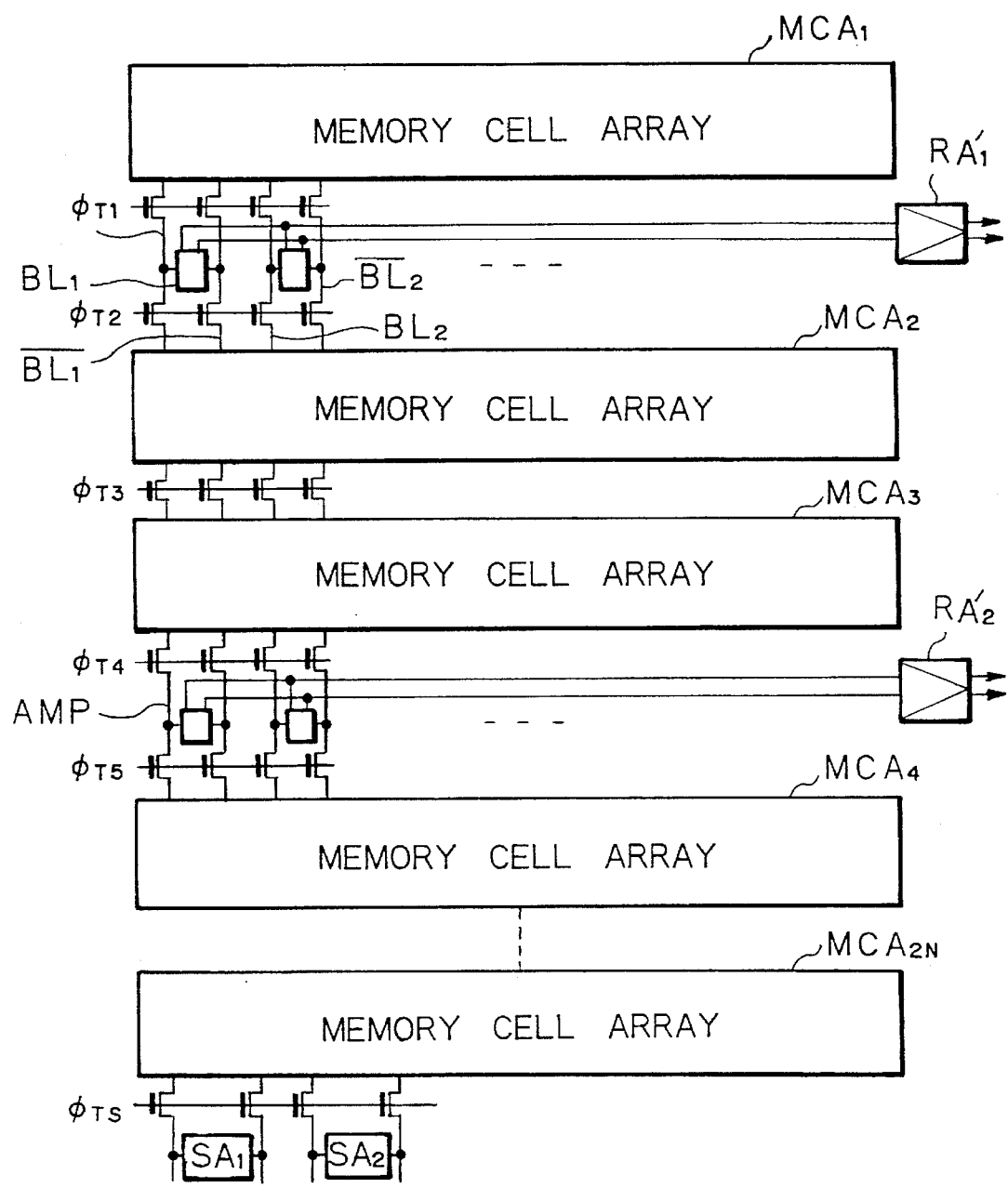
FIG. 11 is a circuit diagram illustrating a third embodiment of the DRAM device according to the present invention.

In FIG. 11, which illustrates a third embodiment of the present invention, the memory cells are divided into 2N (N=2, 3, . . .) memory cell arrays $MCA_1$, $MCA_2$, . . . , and $MCA_{2N}$. In FIG. 11, a row of amplifiers AMP and a read amplifier such as $RA_1'$ are provided for every two memory cell arrays. Also, transistors controlled by clock signals $\phi_{T1}$, $\phi_{T2}$, . . . are provided between the memory cell arrays such as $MCA_2$ and $MCA_3$ and between the memory cell array such as $MCA_1$ and the row of amplifiers AMP.

Thus, in the third embodiment, the capacitance of the bit lines of one selected memory cell array contributing to a read operation does not includes that of the bit lines of the other non-selected memory cell arrays including the capacitance of the sense amplifier $SA_1$, since the bit lines of the other memory cell arrays as well as the sense amplifier $SA_1$ are separated from the bit lines $BL_1$ and $\overline{BL_1}$ of the selected memory cell array connected, before the sense amplifier $SA_1$ is operated. That is, the capacitance contributed to the read operation is remarkably reduced as compared with the prior art, and therefore, the levels of signals at the bit lines $BL_1$ and $\overline{BL_1}$ before the operation of the sense amplifier $SA_1$ can be remarkably increased as compared with the prior art, to thereby contribute to the operation of the amplifier AMP.

As explained hereinbefore, according to the present invention, since signals at bit lines are transferred to read bus lines special for a read operation before the operation of sense amplifiers, a read operation speed can be enhanced.

I claim:

1. A dynamic semiconductor memory device comprising:

a plurality of word lines;

a plurality of bit lines;

a plurality of dynamic memory cells, each connected between one of said word lines and one of said bit lines;

a plurality of sense amplifiers, each connected to one pair of said bit lines;

a plurality of switching circuits, each connected between one pair of said bit lines and one of said sense amplifier;

two read bus lines;

a plurality of switching amplifiers, each connected between one pair of said bit lines and said read bus lines; and a control means, connected to said sense amplifiers, said switching circuits and said switching amplifiers, for turning ON one of said switching amplifiers to carry out a read operation, and thereafter, turning ON said switching circuits to carry out a refresh operation.

2. A device as set forth in claim 1, wherein said control means activates sense amplifiers after said switching circuits are turned ON.

3. A device as forth in claim 1, further comprising a read amplifier, connected to said read bus lines, for amplifying voltages at said read bus lines.

4. A device as set forth in claim 1, wherein each of said switching amplifiers comprises:

first and second transistors, each having a drain connected to one of said read bus lines and a gate connected to one of said bit lines; and third and fourth transistors each having a drain connected to a source of one of said first and second transistors, a gate controlled by said control means and a source connected to a definite voltage source.

5. A dynamic semiconductor memory device comprising:

a plurality of word lines;

a plurality of bit lines;

a plurality of dynamic memory cells, each connected between one of said word lines and one of said bit lines;

a plurality of sense amplifiers, each connected to one pair of said bit lines;

a plurality of switching circuits, each connected between one pair of said bit lines and one of said sense amplifier;

two read bus lines;

a plurality of switching amplifiers, each connected capacitively between one pair of said bit lines and said read bus lines;

a read amplifier connected to said read bus lines; and a control means, connected to said word lines, said sense amplifiers, said switching circuit, said switching amplifiers and said read amplifier, for selecting one of said word lines to enter a selection mode, thereafter operating one of said switching amplifiers and said read amplifier to enter a read mode, and thereafter operating one of said switching circuits and said sense amplifiers to enter a refresh mode.

6. A device as set forth in claim 5, wherein each of said switching amplifiers comprises:

first and second transistors, each having a drain connected to one of said read bus lines and a gate connected to one of said bit lines; and third and fourth transistors each having a drain connected to a source of one of said first and second transistors, a gate controlled by said control means and a source connected to a definite voltage source.

7. A dynamic semiconductor memory device comprising:

a first group of word lines;

a second group of word lines;

a plurality of bit lines;

a plurality of dynamic memory cells, each connected between one of said word lines and one of said bit lines;

a plurality of sense amplifiers, each connected to one pair of said bit lines;

a plurality of first switching circuits, each connected between one pair of said bit lines and one of said sense amplifier;

two read bus lines;

a plurality of switching amplifiers, each connected between one pair of said bit lines and said read bus lines;

a plurality of second switching circuits, each provided between said first group of word lines and one of said switching amplifiers, for connecting a portion of said bit lines on the side of said first group of word lines to the one of said switching amplifiers;

a plurality of third switching circuits, each provided between said second group of word lines and one of said switching amplifiers, for connecting a portion of said bit lines on the side of said second group of word lines to the one of said switching amplifiers;

a control means, connected to said sense amplifiers, said first, second and third switching circuits and said switching amplifiers, for turning ON one of said second and third switching circuits and one of said switching amplifiers to carry out a read operation, and thereafter, turning ON said first switching circuits and the other of said second and third switching circuits to carry out a refresh operation.

8. A device as set forth in claim 7, wherein said control means activates sense amplifiers after said first switching circuits is turned ON.

9. A device as forth in claim 7, further comprising a read amplifier, connected to said read bus lines, for amplifying voltages at said read bus lines.

10. A device as set forth in claim 7, wherein each of said switching amplifiers comprises:

first and second transistors, each having a drain connected to one of said read bus lines and a gate connected to one of said bit lines; and third and fourth transistors each having a drain connected to a source of one of said first and second transistors, a gate controlled by said control means and a source connected to a definite voltage source.

11. A dynamic semiconductor memory device comprising:

a first group of word lines;

a second group of word lines;

a plurality of bit lines;

a plurality of dynamic memory cells, each connected between one of said word lines and one of said bit lines;

a plurality of sense amplifiers, each connected to one pair of said bit lines;

a plurality of first switching circuits, each connected between one pair of said bit lines and one of said sense amplifier;

two read bus lines;

a plurality of switching amplifiers, each connected capacitively between one pair of said bit lines and said read bus lines;

a plurality of second switching circuits, each provided between said first group of word lines and one of said switching amplifiers, for connecting a portion of said bit lines on the side of said first group of word lines to the one of said switching amplifiers;

a plurality of third switching circuits, each provided between said second group of word lines and one of said switching amplifiers, for connecting a portion of said bit lines on the side of said second group of word lines to the one of said switching amplifiers;

a read amplifier connected to said read bus lines; and a control means, connected to said sense amplifiers, said first, second and third switching circuits, said switching amplifiers and said read amplifier, for turning ON one of said second switching circuits said third switching circuits and selecting one of said word lines to enter a selection mode, thereafter, operating one of said switching amplifiers and said read amplifier to enter a read mode, and thereafter turning ON said first switching circuits and the other of said second and third switching circuits and operating said sense amplifiers to enter a refresh mode.

12. A device as set forth in claim 11, wherein each of said switching amplifiers comprises:

first and second transistors, each having a drain connected to one of said read bus lines and a gate connected to one of said bit lines; and third and fourth transistors each having a drain connected to a source of one of said first and second transistors, a gate controlled by said control means and a source connected to a definite voltage source.

13. A dynamic semiconductor memory device comprising:

a plurality of groups of word lines;

a plurality of bit lines;

a plurality of dynamic memory cells, each connected between one of said word lines and one of said bit lines;

a plurality of sense amplifiers, each connected to one pair of said bit lines;

a plurality of first switching circuits, each connected between one pair of said bit lines and one of said sense amplifier;

a plurality of pairs of read bus lines, each pair being provided for every two groups of said word lines;

a plurality of groups of switching amplifiers, each group connected between one pair of one group of said bit lines and said read bus lines;

a plurality of groups of second switching circuits, each group provided between one group of said word lines and one group of said switching amplifiers, for connecting a portion of said bit lines on the side of the one group of said word lines to the one group of said switching amplifiers; and a control means, connected to said sense amplifiers, said first and second switching circuits and said switching amplifiers, for turning ON one group of said second switching circuits and one group of said switching amplifiers to carry out a read operation, and thereafter, turning ON said first switching circuits and the other group of said second switching circuits to carry out a refresh operation.

14. A device as set forth in claim 13, wherein said control means activates sense amplifiers after said first switching circuits is turned ON.

15. A device as forth in claim 13, further comprising a plurality of read amplifiers, each connected to one pair of said read bus lines, for amplifying voltages at the pair of said read bus lines.

16. A device as set forth in claim 13, wherein each of said switching amplifiers comprises:

first and second transistors, each having a drain connected to one of said read bus lines and a gate connected to one of said bit lines; and third and fourth transistors each having a drain connected to a source of one of said first and second transistors, a gate controlled by said control means and a source connected to a definite voltage source.

17. A dynamic semiconductor memory device comprising:

a plurality of groups of word lines;

a plurality of bit lines;

a plurality of dynamic memory cells, each connected between one of said word lines and one of said bit lines;

a plurality of sense amplifiers, each connected to one pair of said bit lines;

a plurality of first switching circuits, each connected between one pair of said bit lines and one of said sense amplifier;

a plurality of pairs of read bus lines, each pair being provided for every two groups of said word lines;

a plurality of groups of switching amplifiers, each group connected capacitively between one pair of one group of said bit lines and said read bus lines;

a plurality of groups of second switching circuits, each group provided between one group of said word lines and one group of said switching amplifiers, for connecting a portion of said bit lines on the side of the one group of said word lines to the one group of said switching amplifiers;

a plurality of read amplifiers, each connected to one group of said read bus lines; and a control means, connected to said sense amplifiers, said first and second switching circuits, said switching amplifiers and said read amplifiers, for turning ON one group of said second switching circuits and selecting one group of said word lines to enter a selection mode, thereafter, operating one group of said switching amplifiers and one of said read amplifiers to enter a read mode, and thereafter turning ON said first switching circuits and the other groups of said second switching circuits and operating said sense amplifiers to enter a refresh mode.

18. A device as set forth in claim 17, wherein each of said switching amplifiers comprises:

first and second transistors, each having a drain connected to one of said read bus lines and a gate connected to one of said bit lines; and third and fourth transistors each having a drain connected to a source of one of said first and second transistors, a gate controlled by said control means and a source connected to a definite voltage source.

* * * * *

UNITED STATES PATENT AND TRADEMARK OFFICE
CERTIFICATE OF CORRECTION

PATENT NO. : 5,574,696
DATED : November 12, 1996
INVENTOR(S) : Tatsunori Murotani It is certified that error appears in the above-indentified patent and that said Letters Patent is hereby corrected as shown below:

Title page, item [73], Assignee: should read --NEC Corporation, Tokyo, Japan --.

Column 5, line 59, delete " $\overline{B}_1$ " and insert therefor -- $\overline{BL}_1$ --.

Signed and Sealed this

Eleventh Day of March, 1997

*Attest:*

BRUCE LEHMAN

*Attesting Officer*     *Commissioner of Patents and Trademarks*